(12) United States Patent
Lee et al.

(10) Patent No.: US 9,587,172 B2
(45) Date of Patent: Mar. 7, 2017

(54) ORGANIC LIGHT-EMITTING DIODE AND METHOD OF MANUFACTURING THE SAME

(75) Inventors: Jung-Hyoung Lee, Daejeon (KR); Se-Hwan Son, Daejeon (KR); Min-Soo Kang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 301 days.

(21) Appl. No.: 13/121,983

(22) PCT Filed: Oct. 1, 2009

(86) PCT No.: PCT/KR2009/005660
§ 371 (c)(1),
(2), (4) Date: Mar. 31, 2011

(87) PCT Pub. No.: WO2010/039009
PCT Pub. Date: Apr. 8, 2010

(65) Prior Publication Data
US 2011/0180792 A1  Jul. 28, 2011

(30) Foreign Application Priority Data

Oct. 1, 2008 (KR) .................. 10-2008-0096732

(51) Int. Cl.
| | | |
|---|---|---|
| H01L 51/54 | (2006.01) | |
| H01L 33/42 | (2010.01) | |
| C09K 11/06 | (2006.01) | |
| H05B 33/26 | (2006.01) | |
| H05B 33/28 | (2006.01) | |

(Continued)

(52) U.S. Cl.
CPC .............. *C09K 11/06* (2013.01); *H05B 33/26* (2013.01); *H05B 33/28* (2013.01); C09K 2211/1007 (2013.01); C09K 2211/1011 (2013.01); C09K 2211/1044 (2013.01); *H01L 51/0072* (2013.01); *H01L 51/5052* (2013.01)

(58) Field of Classification Search
CPC ............ C09K 11/06; C09K 2211/1007; C09K 2211/1011; C09K 2211/1044; C09K 11/00; H01L 51/0072; H01L 51/5052; H01L 51/50; H05B 33/26; H05B 33/28; H05B 33/14
See application file for complete search history.

(56) References Cited

U.S. PATENT DOCUMENTS 5,645,948 A    7/1997  Shi et al.
6,262,441 B1 *  7/2001  Bohler et al. ................ 257/103
(Continued)

FOREIGN PATENT DOCUMENTS

CN    1361650 A    7/2002
CN    1427654 A    7/2003
(Continued)

*Primary Examiner* — Dawn Garrett
(74) *Attorney, Agent, or Firm* — Dentons US LLP

(57) ABSTRACT

The present invention provides an organic light emitting diode comprising a substrate; a transparent cathode; an anode; and an organic material layer interposed between the transparent cathode and the anode, wherein the organic material layer comprises a light emitting layer and an n-type doped electron transport layer, the n-type doped electron transport layer includes an electron transport material and an n-type dopant and is disposed between the transparent cathode and the light emitting layer, and a method for manufacturing the same.

9 Claims, 6 Drawing Sheets

(51) Int. Cl.
*H01L 51/00* (2006.01)
*H01L 51/50* (2006.01)

(56) References Cited

U.S. PATENT DOCUMENTS

| | | | |
|---|---|---|---|
| 6,396,209 B1* | 5/2002 | Kido et al. | 313/504 |
| 6,566,807 B1* | 5/2003 | Fujita et al. | 313/506 |
| 7,318,966 B2 | 1/2008 | Tominaga et al. | |
| 2002/0086180 A1* | 7/2002 | Seo et al. | 428/690 |
| 2002/0158242 A1 | 10/2002 | Son et al. | |
| 2003/0143428 A1* | 7/2003 | Kim et al. | 428/690 |
| 2003/0170491 A1* | 9/2003 | Liao et al. | 428/690 |
| 2005/0173700 A1 | 8/2005 | Liao et al. | |
| 2006/0033115 A1 | 2/2006 | Blochwitz et al. | |
| 2006/0038484 A1 | 2/2006 | Noh et al. | |
| 2006/0049419 A1 | 3/2006 | Tanaka et al. | |
| 2006/0097227 A1 | 5/2006 | Okajima et al. | |
| 2006/0202614 A1* | 9/2006 | Li | B82Y 10/00 313/506 |
| 2006/0251922 A1* | 11/2006 | Liao et al. | 428/690 |
| 2006/0269782 A1 | 11/2006 | Liao et al. | |
| 2007/0020484 A1* | 1/2007 | Kim et al. | 428/690 |
| 2007/0034864 A1* | 2/2007 | Liu | 257/40 |
| 2007/0063641 A1* | 3/2007 | Cok | H01L 51/5271 313/506 |
| 2007/0090756 A1* | 4/2007 | Okada et al. | 313/506 |
| 2007/0122656 A1 | 5/2007 | Klubek et al. | |
| 2007/0200490 A1 | 8/2007 | Kawamura et al. | |
| 2007/0228948 A1 | 10/2007 | Miura | |
| 2007/0267958 A1 | 11/2007 | Kitazawa et al. | |
| 2008/0008905 A1 | 1/2008 | Yamazaki | |
| 2008/0042556 A1 | 2/2008 | Chu et al. | |
| 2008/0118724 A1 | 5/2008 | Cina et al. | |
| 2009/0091242 A1* | 4/2009 | Liao et al. | 313/504 |
| 2009/0096352 A1 | 4/2009 | Spindler et al. | |
| 2009/0110956 A1 | 4/2009 | Begley et al. | |
| 2009/0284134 A1* | 11/2009 | Iida | C07D 209/86 313/504 |
| 2010/0108990 A1 | 5/2010 | Hosokawa et al. | |
| 2011/0079774 A1 | 4/2011 | Kang et al. | |

FOREIGN PATENT DOCUMENTS

| | | |
|---|---|---|
| CN | 1602556 A | 3/2005 |
| CN | 102067730 A | 5/2009 |
| EP | 2 201 626 A1 | 6/2010 |
| JP | 04-357694 A | 12/1992 |
| JP | 2000-340364 A | 12/2000 |
| JP | 2002-313583 A | 10/2002 |
| JP | 2004-107263 A | 4/2004 |
| JP | 2005520307 A | 7/2005 |
| JP | 2006-19022 A | 1/2006 |
| JP | 2007-039405 A | 2/2007 |
| JP | 2007-129170 A | 5/2007 |
| JP | 2007-523451 A | 8/2007 |
| JP | 2007-294901 A | 11/2007 |
| JP | 2008034367 A | 2/2008 |
| JP | 2008510312 A | 4/2008 |
| JP | 2008-522395 A | 6/2008 |
| KR | 10-0691543 | 8/2003 |
| KR | 10-2004-0088470 A | 10/2004 |
| KR | 10-2006-0050824 A | 5/2006 |
| KR | 10-2007-0052764 A | 5/2007 |
| KR | 10-0867493 | 12/2007 |
| KR | 10-0923197 | 6/2009 |
| WO | WO 03/060956 A2 | 7/2003 |
| WO | WO 2005/097756 A1 | 10/2005 |
| WO | 2006019270 A1 | 2/2006 |
| WO | WO 2007/052985 A1 * | 5/2007 |
| WO | 2009051684 A1 | 4/2009 |

* cited by examiner

ORGANIC LIGHT-EMITTING DIODE AND METHOD OF MANUFACTURING THE SAME

TECHNICAL FIELD

This application claims the priority to PCT/KR2009/005660 filed on Oct. 1, 2009 and Korean Patent Application No. 10-2008-0096732 filed on Oct. 1, 2008, all of which are hereby incorporated by reference in their entirety. The present invention relates to an organic light emitting diode and a method for manufacturing the same. More particularly, the present invention relates to an organic light emitting diode and a method for manufacturing the same, in which a transparent electrode that is made of a material having a high work function such as a transparent metal oxide is capable of being used as a cathode.

BACKGROUND ART

An organic light emitting diode (OLED) is generally composed of two electrodes (an anode and a cathode) and one or more organic material layers that are disposed between the electrodes. In the organic light emitting diode having this structure, if a voltage is applied between the two electrodes, a hole flows from an anode and an electron flows from a cathode into an organic material layer, they are recombined with each other to form an exciton, and a photon corresponding to an energy difference is emitted while the exciton falls to the base state. By this principle, the organic light emitting diode emits visible rays, and an information display diode or illumination diode may be manufactured by using this.

In the organic light emitting diode, there are a bottom emission type in which light that is generated in the organic material layer is emitted to a substrate and a top emission type in which light is emitted in the opposite direction of the substrate. In a both-side emission type, light is emitted in the substrate direction and in the opposite direction of the substrate.

In the top emission or both-side emission organic light emitting diode, an electrode that is not contacted with the substrate and disposed at the opposite side of the substrate should be transparent at a visible ray region. In the organic light emitting diode, a conductive oxide film such as IZO (indium zinc-oxide) or ITO (indium tin-oxide) is used as the transparent electrode. However, since the conductive oxide film has a very high work function, in the case of when the cathode is formed by using this, it is difficult to inject electrons from the cathode to the organic material layer. Accordingly, operation voltage of the organic light emitting diode is largely increased, and important diode properties such as light emission efficiency and the like are deteriorated. Therefore, there is a demand for manufacturing the top emission or both-side emission organic light emitting diode that has a structure in which the substrate, the cathode, the organic material layer and the transparent anode are sequentially layered, that is, an inverted structure.

DISCLOSURE

Technical Problem

In the case of when a both-side emission organic light emitting diode is manufactured, even though the organic light emitting diode is manufactured in an inverted structure, it is difficult to use a conductive oxide film having a high work function which is a transparent material as a material of a cathode contacting with a substrate. Accordingly, in the organic light emitting diode of the inverted structure, there is a demand for developing a method for forming an anode that is an upper electrode and a cathode that is contacted with a substrate by using the transparent material such as the conductive oxide film.

Therefore, it is an object of the present invention to provide an organic light emitting diode and a method for manufacturing the same, in which a transparent electrode that is made of a material having a high work function such as a transparent metal oxide is capable of being used as an anode and a cathode in the organic light emitting diode of the inverted structure.

Technical Solution

The present invention provides an organic light emitting diode that includes a substrate; a transparent cathode that is disposed on the substrate; an anode; and an organic material layer that is disposed between the transparent cathode and the anode, wherein the organic material layer includes a light emitting layer and an n-type doped electron transport layer, the n-type doped electron transport layer includes an electron transport material and an n-type dopant and is disposed between the transparent cathode and the light emitting layer.

The present invention provides a method for manufacturing an organic light emitting diode, which includes the steps of forming a transparent cathode on a substrate; forming an organic material layer on the transparent cathode; and forming an anode on the organic material layer, wherein the forming of the organic material layer includes forming an n-type doped electron transport layer that includes an electron transport material and an n-type dopant on the transparent cathode, and forming a light emitting layer.

In addition, the present invention provides a lighting apparatus comprising the organic light emitting diode.

Advantageous Effects

According to the present invention, a cathode in the organic light emitting diode of the inverted structure may be formed of a transparent electrode that is made of a material having a high work function such as a transparent metal oxide. Therefore, in the present invention, there may be provided an organic light emitting diode that is capable of emitting light in both side directions. The both-side emission organic light emitting diode is useful for the purpose of illumination.

BEST MODE

Figure 1:
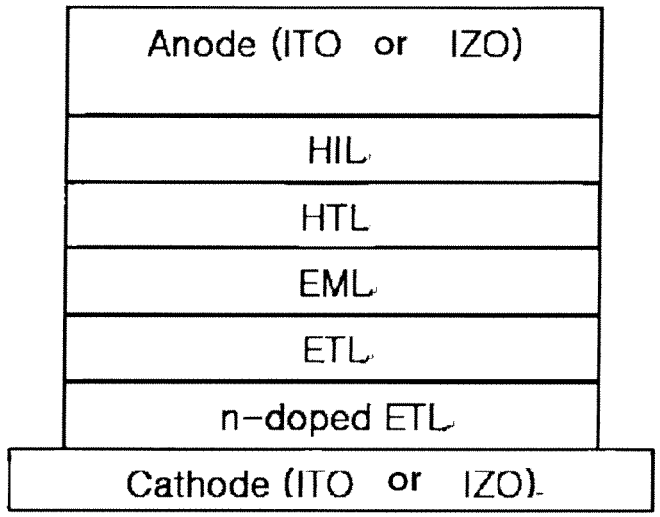
FIGS. 1 and 2 are views that illustrate a layering structure of an organic light emitting diode according to the present invention.

An organic light emitting diode according to the present invention includes a substrate; a transparent cathode that is disposed on the substrate; an anode; and an organic material layer that is disposed between the transparent cathode and the anode, wherein the organic material layer includes a light emitting layer and an n-type doped electron transport layer, the n-type doped electron transport layer includes an electron transport material and an n-type dopant and is disposed between the cathode and the light emitting layer.

The present invention is characterized in that the organic light emitting diode has an inverted structure in which the cathode is provided on the substrate and the cathode is transparent.

In the organic light emitting diode having a positive structure, in the case of when the cathode is formed of a transparent electrode, in general, a sputtering method is used, and in this case, since the electron transport layer cannot endure sputtering damage, diode defects occur by a damage to the organic material layer. However, in the present invention, the cathode is formed of the transparent electrode, and the inverted structure which includes the cathode as the lower electrode is formed, such that the above problems can be solved.

In addition, the present inventors have found that in the case of when the cathode is formed of the transparent material, since the work function of the transparent cathode is very high, it is impossible to drive the diode by energy difference to the electron transport material. Therefore, in the present invention, in order to overcome a work function difference between the organic material layer and the transparent cathode, the n-type doped electron transport layer is provided. By this configuration, in the present invention, in the case of when the transparent cathode is formed on the substrate by using the transparent material such as metal oxides having the very high work function, the diode can be driven, and as a result thereof, there may be provided the organic light emitting diode of the inverted structure that is provided with the transparent cathode on the substrate.

In the case of when the cathode is formed of an opaque material, even though the electron transport layer is n-type doped and not n-type doped, the diode can be driven. However, in the case of when the cathode is formed of the transparent material, if the electron transport layer is formed by using only the electron transport material, the diode can be driven by only forming the electron transport layer in a form of n-type doped electron transport layer. Therefore, in the case of when the cathode is formed of the transparent material and in the case of when it is formed of the opaque material, whether the electron transport layer is n-type doped has very different technical meaning. In detail, in the case of when the cathode is formed of the opaque material, the application of technology in which the electron transport layer is n-type doped has a meaning of increasing the concentration of carrier. However, in the case of when the cathode is formed of the transparent material, the application of technology which the electron transport layer is n-type doped has an absolute technical meaning of determining a possibility of diode driving. In other words, only in the case of when the electron transport layer is n-type doped according to the present invention, the cathode of the transparent organic light emitting diode of the inverted structure may be formed.

Figure 7:
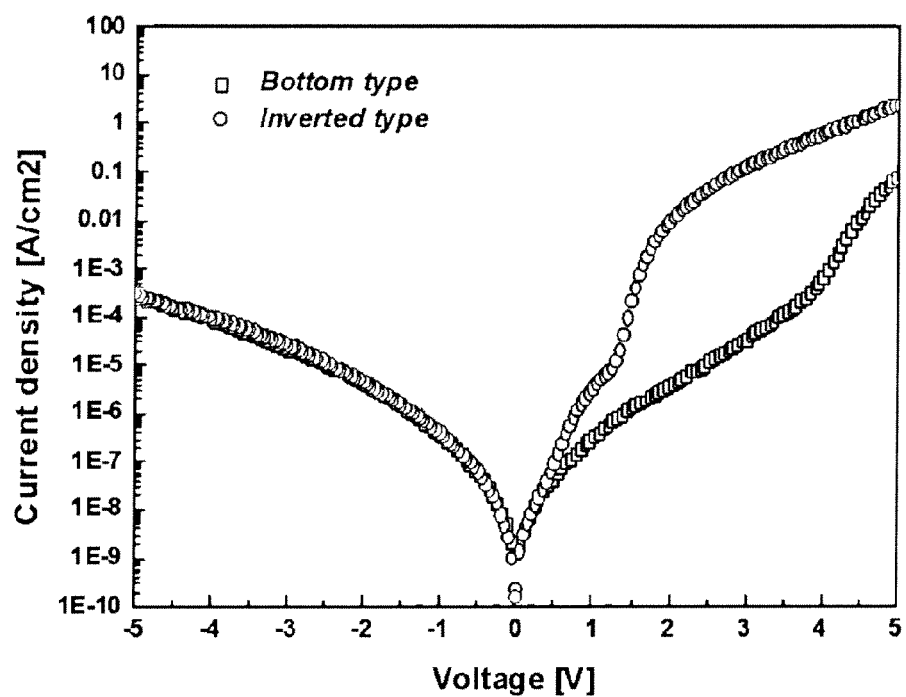
FIG. 7 is a graph that illustrates a difference of electron injection efficiency in a positive structure and an inverted structure.

In addition, the present inventors have found the fact that the electron transport amount is increased by two to three times because of a change in band alignment by surface dipole in the inverted structure rather than in the positive structure. FIG. 7 is a graph that illustrates comparison of electron injection characteristics in a positive structure and an inverted structure.

Even in the organic light emitting diode according to the present invention, it is preferable that the anode is transparent.

In the present invention, when the electrode is transparent, transmissivity of light that is generated from the light emitting layer of the organic light emitting diode is 50% or more, preferably 80% or more, more preferably 85% or more, and still more preferably 90% or more.

The transparent cathode and the anode each may be formed of the electrode material having the work function of 2.7 eV or more. It is advantageous in terms of process that the work function of the electrode material is 2.7 eV or more. It is more preferable in terms of transparency that the work function is 4.5 eV or more.

The transparent cathode and the anode are each formed of one or more transparent metal oxides that are selected from IZO (Indium Zinc Oxide) and zinc oxides (ZnO). Since in the organic light emitting diode according to the present invention, the cathode is transparent, it may be a bottom emission type, and in the case of when the cathode and the anode are transparent, it may be a both-side emission type.

Herein, the n-type doped electron transport layer includes an electron transport material; and an n-type dopant. The n-type dopant may include one or more that are selected from the group consisting of metal halogenates, metal oxides, organic metal, alkali metal, alkali earth metal, alkali metal compounds and alkali earth metal compounds.

The n-type dopant may be, for example, NaF, CSF, $MgF_2$, $CaF_2$, MgO, CaO, BaO, SrO, $Li_2O$, $Na_2O$, $K_2O$, $Cs_2O$, $Cs_2CO_3$, Mg, Ca, Li, Na, K, Cs, LiF or KF. In addition, LiF, and KF may be used as the n-type dopant.

In the present invention, in the formation of the layer serving as the electron transport layer among the organic material layers, by doping the n-type dopant to the electron transport material, the cathode may be formed of the transparent material having the high work function and properties of the organic light emitting diode may be largely improved. Therefore, even though the electron injection layer that is considered to be necessarily required in order to efficiently drive a known organic light emitting diode is not separately formed, the organic light emitting diode may be efficiently driven. In addition, in the case of when the n-type dopant is doped to the above electron transport material, it is advantageous in terms of a life span of the diode.

In the present invention, the electron transport material is a material that is capable of transporting electrons injected from the cathode to the light emitting layer, and has large mobility to the electron.

The electron transport material may be a compound that includes one or more functional groups selected from the group consisting of an imidazole group, an oxazole group, a thiazol group, quinoline, and a phenanthroline group.

Detailed examples of the compound that includes one or more functional groups selected from the group consisting of the imidazole group, the oxazole group, and the thiazol group is the compound of the following Formula 1 or Formula 2:

[Formula 1]

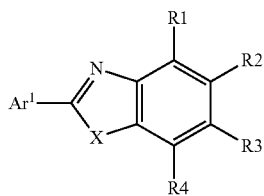

wherein $R^1$ to $R^4$ may be the same as or different from each other, and each independently hydrogen atom; $C_1\sim C_{30}$ alkyl group that is substituted or unsubstituted by one or more groups selected from the group consisting of halogen atom, amino group, nitrile group, nitro group, $C_1\sim C_{30}$ alkyl group, $C_2\sim C_{30}$ alkenyl group, $C_1\sim C_{30}$ alkoxy group, $C_3\sim C_{30}$ cycloalkyl group, $C_3\sim C_{30}$ heterocycloalkyl group, $C_5\sim C_{30}$ aryl group and $C_2\sim C_{30}$ heteroaryl group; $C_3\sim C_{30}$ cycloalkyl group that is substituted or unsubstituted by one or more groups selected from the group consisting of halogen atom, amino group, nitrile group, nitro group, $C_1\sim C_{30}$ alkyl group, $C_2\sim C_{30}$ alkenyl group, $C_1\sim C_{30}$ alkoxy group, $C_3\sim C_{30}$ cycloalkyl group, $C_3\sim C_{30}$ heterocycloalkyl group, $C_5\sim C_{30}$ aryl group and $C_2\sim C_{30}$ heteroaryl group; $C_5\sim C_{30}$ aryl group that is substituted or unsubstituted by one or more groups selected from the group consisting of halogen atom, amino group, nitrile group, nitro group, $C_1\sim C_{30}$ alkyl group, $C_2\sim C_{30}$ alkenyl group, $C_1\sim C_{30}$ alkoxy group, $C_3\sim C_{30}$ cycloalkyl group, $C_3\sim C_{30}$ heterocycloalkyl group, $C_5\sim C_{30}$ aryl group and $C_2\sim C_{30}$ heteroaryl group; $C_2\sim C_{30}$ heteroaryl group that is substituted or unsubstituted by one or more groups selected from the group consisting of halogen atom, amino group, nitrile group, nitro group. $C_1\sim C_{30}$ alkyl group, $C_2\sim C_{30}$ alkenyl group, $C_1\sim C_{30}$ alkoxy group, $C_3\sim C_{30}$ cycloalkyl group, $C_3\sim C_{30}$ heterocycloalkyl group, $C_5\sim C_{30}$ aryl group and $C_2\sim C_{30}$ heteroaryl group, or may form an aliphatic, aromatic, aliphatic hetero or aromatic hetero condensated ring or a spiro bond in conjunction with an adjacent group; $Ar^1$ is hydrogen atom, substituted or unsubstituted aromatic ring or substituted or unsubstituted aromatic hetero ring; X is O, S or $NR^a$; $R^a$ is hydrogen, $C_1$-$C_7$ aliphatic hydrocarbon, aromatic ring or aromatic hetero ring,

[Formula 2]

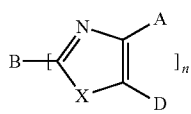

wherein X is O, S, $NR^b$ or $C_1$-$C_7$ divalent hydrocarbon group; A, D and $R^b$ are each hydrogen atom, nitrile group (—CN), nitro group (—$NO_2$), $C_1$-$C_{24}$ alkyl, substituted aromatic ring including $C_5$-$C_{20}$ aromatic ring or hetero atom, halogen, or alkylene including alkylene or hetero atom that is capable of forming a fused ring in conjunction with an adjacent ring; A and D may be connected to each other to form an aromatic or hetero aromatic ring; B is a connection unit in the case of when n is 2 or more, and substituted or unsubstituted alkylene or arylene that connects a plurality of hetero rings so that they are conjugation or nonconjugation connection, and in the case of when n is 1, it is substituted or unsubstituted alkyl or aryl; and n is an integer in the range of 1 to 8.

As examples of the compound of Formula 1 that is the compound adopted as the organic material layer, there is a compound that is disclosed in Korean Unexamined Patent Application Publication No. 2003-0067773, and as examples of the compound of Formula 2, there are a compound that is disclosed in U.S. Pat. No. 5,645,948 and a compound that is disclosed in WO05/097756. The contents of the documents are incorporated in the present specification.

In detail, the compound of the following Formula 3 is also included in the compound of Formula 1:

[Formula 3]

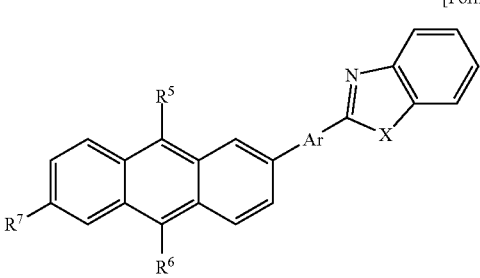

wherein $R^5$ to $R^7$ are the same as or different from each other, and each independently hydrogen atom, $C_1$-$C_{20}$ aliphatic hydrocarbon, aromatic ring, aromatic hetero ring or aliphatic or aromatic condensated ring; Ar is a direct bond, aromatic ring or aromatic hetero ring; and X is O, S or $NR^a$; $R^a$ is hydrogen atom, $C_1$-$C_7$ aliphatic hydrocarbon, aromatic ring or aromatic hetero ring, with the exception of the case of when both $R^5$ and $R^6$ are hydrogen.

In detail, the compound of the following Formula 4 is also included in the compound of Formula 2:

[Formula 4]

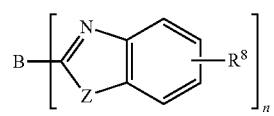

wherein Z is O, S or $NR^b$; $R^8$ and $R^b$ are hydrogen atom, $C_1$-$C_{24}$ alkyl, $C_5$-$C_{20}$ aromatic ring or substituted aromatic ring including the hetero atom, halogen, or alkylene that is capable of forming a fused ring in conjunction with a benzasol ring or alkylene including hetero atom; B is a connection unit in the case of when n is 2 or more, and substituted or unsubstituted alkylene, arylene, substituted alkylene, or substituted arylene that connects a plurality of benzasols so that they are conjugation or nonconjugation connection, and in the case of when n is 1, it is substituted or unsubstituted alkyl or aryl; and n is an integer in the range of 1 to 8.

The preferable compound having the imidazole group includes the compounds having the following structure:

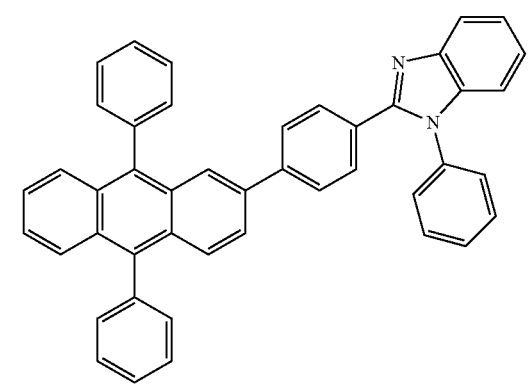
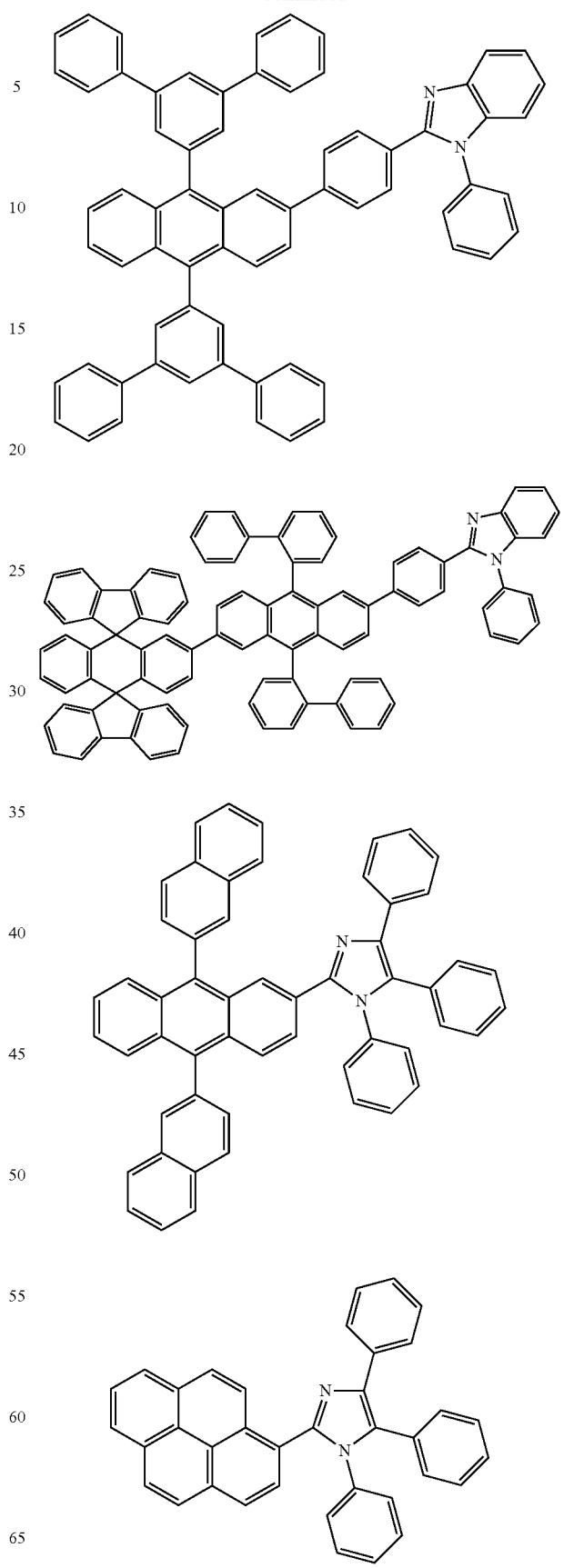

-continued

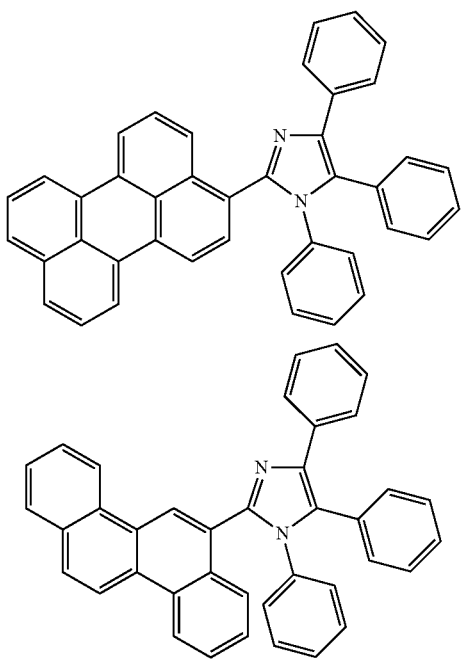

In the present invention, as examples of the compound having the quinoline group, there are the compounds represented by the following Formulas 5 to 11.

[Formula 5]
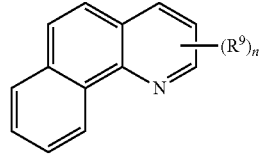

[Formula 6]
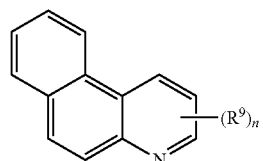

[Formula 7]
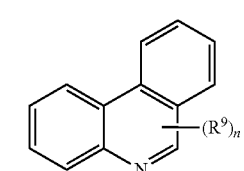

[Formula 8]

[Formula 9]
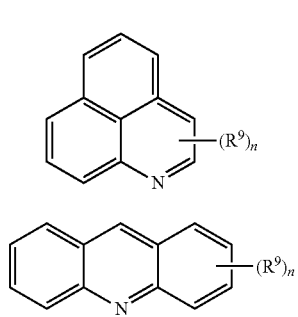

-continued

[Formula 10]
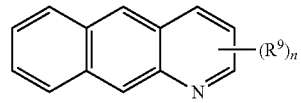

[Formula 11]
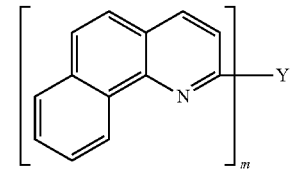

In Formulas 5 to 11, n is an integer in the range of 0 to 9, m is an integer of 2 or more, $R^9$ is selected from hydrogen, alkyl group such as methyl group, ethyl group and the like, cycloalkyl group such as cyclohexyl, norbornyl and the like, aralkyl group such as benzyl group and the like, alkenyl group such as vinyl group, allyl group, and the like, cycloalkenyl group such as cyclopentadienyl group, cyclohexenyl group and the like, alkoxy group such as methoxy group and the like, alkylthio group in which an oxygen atom of ether bond of the alkoxy group is substituted with a sulfur atom, aryl ether group such as phenoxy group and the like, arylthio ether group in which an oxygen atom of ether bond of the aryl ether group is substituted with a sulfur atom, aryl group such as phenyl group naphthyl group, biphenyl group and the like, heterocyclic group such as furyl group, thienyl group, oxazolyl group, pyridyl group, quinolyl group, carbazolyl group and the like, silyl group such as halogen, cyano group, aldehyde group, carbonyl group, carboxyl group, ester group, carbamoyl group, amino group, nitro group, trimethylsilyl group and the like, siloxanyl group that is a group having silicon through an ether bond, and a cyclic structure in respects to the adjacent substituent group; and the substituent groups may be substituted or unsubstituted, and in the case of when n is 2 or more, the substituent groups may be the same as or different from each other, and Y is divalent or more groups of the groups of $R^9$.

The compounds of Formulas 5 to 11 are disclosed in Korean Unexamined Patent Application Publication No. 2007-0118711, and the entire document is incorporated in the present specification for reference.)

In the present invention, as examples of the compound having the phenanthroline group, there are the compounds of the following Formulas 12 to 22, but they are not limited thereto.

[Formula 12]
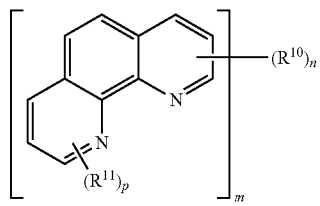

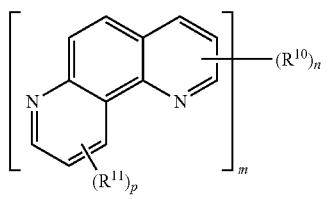

[Formula 13]

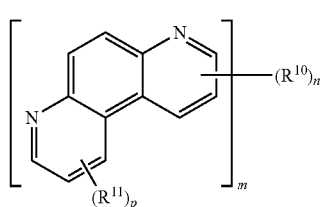

[Formula 14]

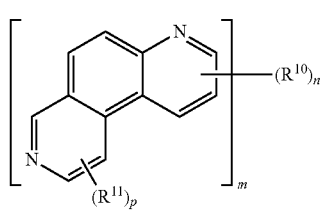

[Formula 15]

In Formulas 12 to 15, m is an integer of 1 or more, n and p are an integer, n+p is 8 or less, in the case of when m is 1, $R^{10}$ and $R^{11}$ are selected from hydrogen, alkyl group such as methyl group, ethyl group and the like, cycloalkyl group such as cyclohexyl, norbornyl and the like, aralkyl group such as benzyl group and the like, alkenyl group such as vinyl group, allyl group, and the like, cycloalkenyl group such as cyclopentadienyl group, cyclohexenyl group and the like, alkoxy group such as methoxy group and the like, alkylthio group in which an oxygen atom of ether bond of the alkoxy group is substituted with a sulfur atom, aryl ether group such as phenoxy group and the like, arylthio ether group in which an oxygen atom of ether bond of the aryl ether group is substituted with a sulfur atom, aryl group such as phenyl group, naphthyl group, biphenyl group and the like, heterocyclic group such as furyl group, thienyl group, oxazolyl group, pyridyl group, quinolyl group, carbazolyl group and the like, silyl group such as halogen, cyano group, aldehyde group, carbonyl group, carboxyl group, ester group, carbamoyl group, amino group, nitro group, trimethylsilyl group and the like, siloxanyl group that is a group having silicon through an ether bond, and a cyclic structure in respects to the adjacent substituent group.

in the case of when m is 2 or more, $R^{10}$ is a direct bond or divalent or more group of the above groups, $R^{11}$ is the same as the case of when m is 1, the substituent groups may be substituted or unsubstituted, and in the case of when n or p is 2 or more, the substituent groups may be the same as or different from each other.

The compounds of Formulas 12 to 15 are disclosed in Korean Unexamined Patent Application Publication Nos. 2007-0052764 and 2007-0118711, and the entire document is incorporated in the present specification for reference.

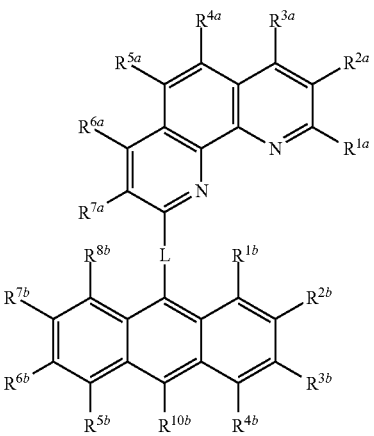

[Formula 16]

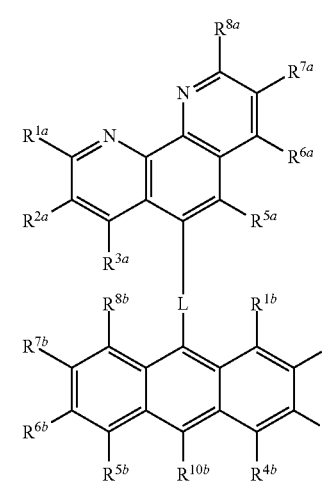

[Formula 17]

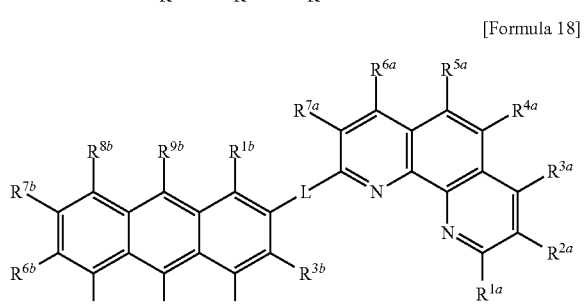

[Formula 18]

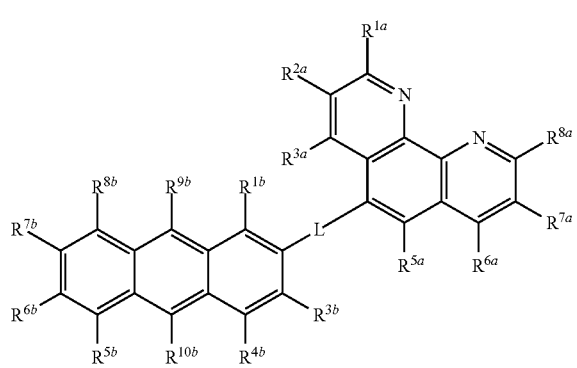

[Formula 19]

In Formulas 16 to 19, $R^{1a}$ to $R^{8a}$ and $R^{1b}$ to $R^{10b}$ are each hydrogen atom, substituted or unsubstituted aryl group having 5 to 60 nucleus atoms, substituted or unsubstituted pyridyl group, substituted or unsubstituted quinolyl group, substituted or unsubstituted alkyl group having 1 to 50 carbon atoms, substituted or unsubstituted cycloalkyl group having 3 to 50 carbon atoms, substituted or unsubstituted aralkyl group having 6 to 50 nucleus atoms, substituted or unsubstituted alkoxy group having 1 to 50 carbon atoms, substituted or unsubstituted aryloxy group having 5 to 50 nucleus atoms, substituted or unsubstituted arylthio group having 5 to 50 carbon atoms, substituted or unsubstituted alkoxycarbonyl group having 1 to 50 carbon atoms, substituted or unsubstituted amino group that is substituted with aryl group having 5 to 50 nucleus atoms, halogen atom, cyano group, nitro group, hydroxyl group or carboxyl group, they may be bonded to each other to form an aromatic ring, and L is substituted or unsubstituted arylene group having 6 to 60 carbon atoms, substituted or unsubstituted pyrydinylene group, substituted or unsubstituted quinolinylene group or substituted or unsubstituted fluorenylene group. The compounds of Formulas 16 to 19 are disclosed in Japanese Unexamined Patent Application Publication No. 2007-39405, and the entire document is incorporated in the present specification for reference.

[Formula 20]

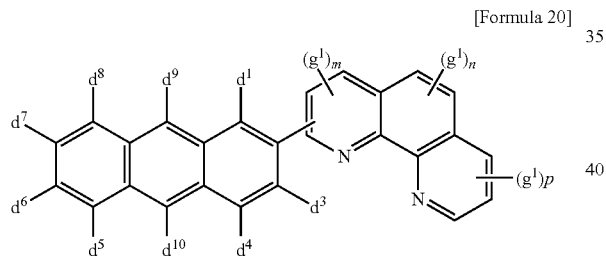

[Formula 21]

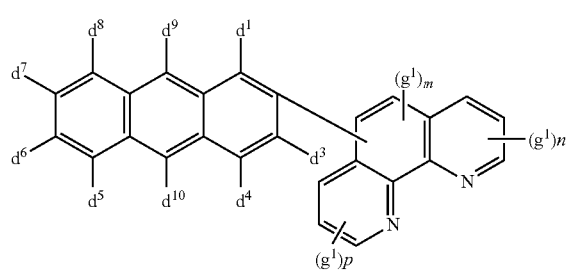

In Formulas 20 and 21, $d^1$, $d^3$ to $d^{10}$ and $g^1$ are each hydrogen or aromatic or aliphatic hydrocarbon group, m and n are each an integer in the range of 0 to 2, and p is an integer in the range of 0 to 3. The compounds of Formulas 20 and 21 are disclosed in U.S. Patent No. 2007/0122656, and the entire document is incorporated in the present specification for reference.

[Formula 22]

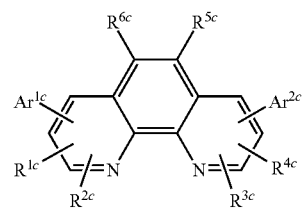

wherein $R^{1c}$ to $R^{6c}$ are each hydrogen atom, substituted or unsubstituted alkyl group, substituted or unsubstituted aralkyl group, substituted or unsubstituted aryl group, substituted or unsubstituted heterocyclic group or halogen atom, and $Ar^{1c}$ and $Ar^{2c}$ are each selected from the following Structural Formulas.

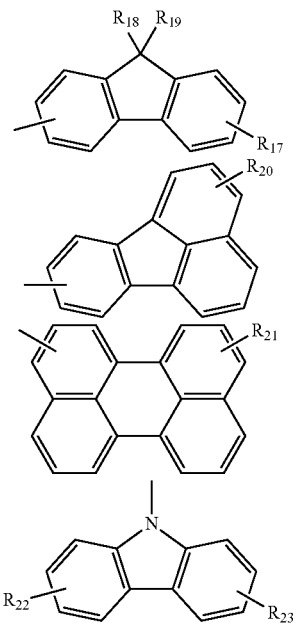

In the Structural Formulas, $R_{17}$ to $R_{23}$ are each hydrogen atom, substituted or unsubstituted alkyl group, substituted or unsubstituted aralkyl group, substituted or unsubstituted aryl group, substituted or unsubstituted heterocyclic group or halogen atom. The compound of Formula 22 is disclosed in Japanese Unexamined Patent Application Publication No. 2004-107263, and the entire document is incorporated in the present specification for reference.

In the present invention, in the formation of the electron transport layer using the electron transport material, the above n-type dopant is doped.

The n-type dopant is included in an amount of preferably 0.5 to 50 wt %, more preferably 1 to 20 wt %, more preferably 3 to 15 wt %, and preferably 5 to 12 wt % on the basis of the total weight of the n-type doped electron transport layer material. It is advantageous in terms of transparency that the content of the n-type dopant is 50 wt % or less. If the content is less than 0.5 wt %, it is difficult to expect a technical effect by n-type doping.

Herein, the n-type dopant may have a concentration gradient in a thickness direction of the n-type doped electron transport layer. In this case, it may be preferable that the n-type dopant exists in the content in the range of 1 to 50 wt % within 50% of the thickness of the n-type doped electron transport layer at the transparent cathode side.

The electron transport layer that includes the electron transport material and the n-type dopant may be formed by using the method that is known in the art. For example, a deposition method, and a solvent process, for example, spin coating, dip coating, doctor blading, screen printing, inkjet printing or heat transfer method may be used.

The organic light emitting diode according to the present invention may be manufactured by using a general manufacturing method and material, except that the electron transport layer is formed on the transparent cathode by using the electron transport material and the n-type dopant, and it may have a structure that is known in the art.

For example, the organic light emitting diode according to the present invention may be manufactured by forming a cathode by depositing metal or metal oxides having the conductivity or an alloy thereof on a substrate by using a PVD (physical vapor deposition) method such as sputtering or e-beam evaporation, forming the organic material layer thereon, and forming an anode thereon.

The organic material layer may include the light emitting layer and the n-type doped electron transport layer, and if necessary, it may further include one or more organic material layers such as the hole injection layer, the hole transport layer, the electron injection layer, and the electric charge blocking layer.

However, it is not limited thereto, but a portion of the layers may be omitted or added. However, in the present invention, unlike a known technology, by not forming a separate electron injection layer, the manufacturing process of the organic light emitting diode is made simple and the organic light emitting diode having excellent performance can be manufactured. Accordingly, the organic light emitting diode according to the present invention may not include the electron injection layer. That is, the electron transport layer that includes the electron transport material and the n-type dopant may be contacted with the cathode. However, the case of when the electron injection layer is included is not excluded from the scope of the present invention. Therefore, the electron injection layer may be provided between the electron transport layer that includes the electron transport material and the n-type dopant and the transparent cathode.

The organic material layer may further include another electron transport layer that is disposed between the n-type doped electron transport layer and the light emitting layer.

Herein, the electron transport layer that is further disposed between the n-type doped electron transport layer and the light emitting layer may be formed of a material that is different from the electron transport material of the n-type doped electron transport layer or may be formed of a material that is the same as the electron transport material of the n-type doped electron transport layer.

In the present invention, it is preferable that the organic material layer at the uppermost side that is most adjacent to the anode that is the upper electrode of the organic material layer includes the compound that is represented by the following Formula 23.

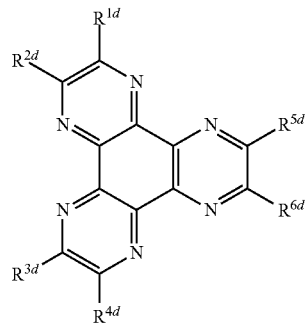

[Formula 23]

wherein $R^{1d}$ to $R^{6d}$ are each selected from the group consisting of hydrogen, halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight-chained or branched-chained $C_1$-$C_{12}$ alkoxy, substituted or unsubstituted straight-chained or branched-chained $C_1$-$C_{12}$ alkyl, substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl and substituted or unsubstituted 5-7 hetero ring.

An electronic diode that is characterized in that the compound of Formula 23 is selected from the compounds of Formulas 23-1 to 23-6.

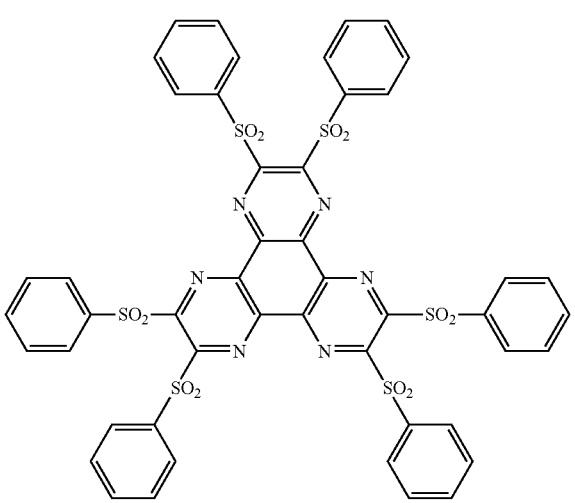

[Formula 23-1]

[Formula 23-2]

[Formula 23-3]

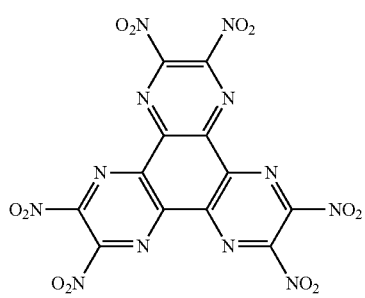

[Formula 23-4]

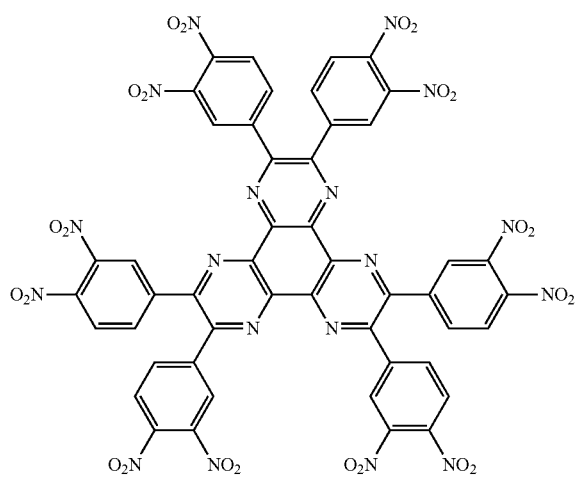

[Formula 23-5]

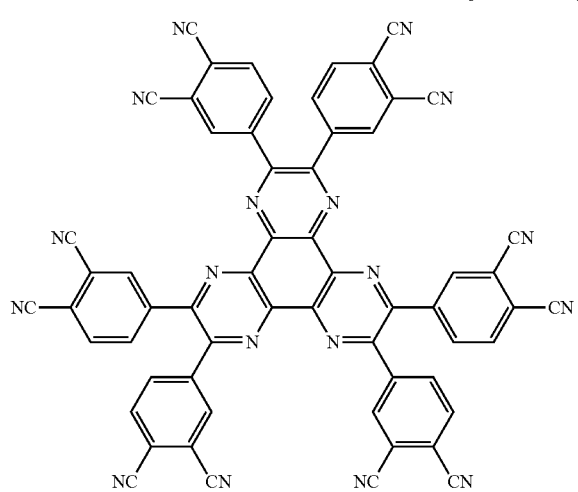

[Formula 23-6]

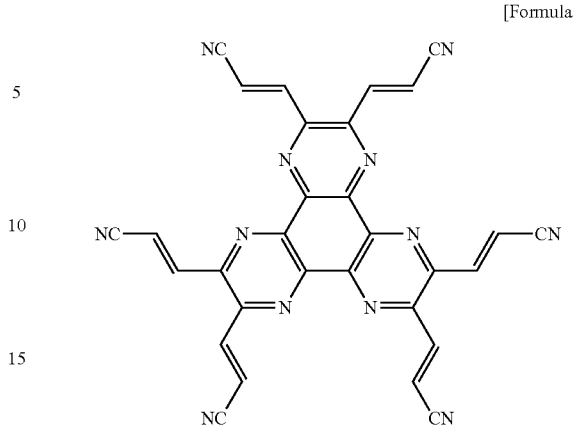

In particular, by forming the hole injection layer that includes the material of Formula 23 as the organic material layer that is most contacted with the anode that is the upper electrode, it is possible to easily provide the organic light emitting diode having the inverted structure in which the upper electrode is the anode.

The organic material layer may be manufactured in a smaller number of layer by using various polymer materials and by using a solvent process, for example, spin coating, dip coating, doctor blading, screen printing, inkjet printing, heat transferring method and the like, in addition to a deposition method.

The light emitting material for forming the light emitting layer is a material that receives the holes and the electrons from the hole transport layer and the electron transport layer, combines them, such that light at a range of visible rays is emitted, and it is preferable to use the material having excellent photon efficiency to fluorescence or phosphorescence. As detailed examples thereof, there are a 8-hydroxyquinoline aluminium complex ($Alq_3$); a carbazole-based compound; a dimerized styryl compound; BAlq; 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, anthracene, and the like, but it is not limited thereto.

The hole transport material for forming the hole transport layer is a material that receives the holes from the anode or the hole injection layer and transfer them to the light emitting layer, and it is preferable to use the material having the large mobility to the holes. As detailed examples thereof, there are arylamine-based organic material, a conductive polymer, and a block copolymer in which a conjugate portion and a conjugate portion are simultaneously included, but it is not limited thereto.

The hole injection material for forming the hole injection layer is a material that is capable of well receiving holes from the anode at a low voltage, and it is preferable that the HOMO (highest occupied molecular orbital) of the hole injection material is a value between the work function of the anode material and the HOMO of the organic material layer around them. Specific examples of the hole injecting material include organic materials of metal porphyrin, oligothiophene and arylamine series, organic materials of hexanitrile hexaazatriphenylene and quinacridone series, organic materials of perylene series, and conductive polymers of anthraquinone, polyaniline, and polythiophene series, but are not limited thereto.

Meanwhile, a method for manufacturing an organic light emitting diode according to the present invention includes the steps of forming a transparent cathode on a substrate; forming an organic material layer on the transparent cathode; and forming an anode on the organic material layer, wherein the forming of the organic material layer includes forming an n-type doped electron transport layer that includes an electron transport material and an n-type dopant on the transparent cathode, and forming a light emitting layer. In the method for manufacturing the organic light emitting diode according to the present invention, since the material and the formation method of each layer are the same as those described above, a detailed description thereof will be omitted.

In addition, the present invention provides a lighting apparatus comprising the organic light emitting diode. Since the organic light emitting diode according to the present invention may be easily formed in a both-side emission structure, and has excellent diode efficiency, it is useful as the lighting diode.

Hereinafter, with reference to FIGS. 1 and 2, the organic light emitting diode having the inverted structure according to the present invention will be described in detail.

FIG. 1 is a view that illustrates an organic light emitting diode having an inverted structure according to a first embodiment of the present invention.

As shown in FIG. 1, the organic light emitting diode according to the first embodiment has a structure in which the transparent cathode that is formed of ITO or IZO, the n-doped electron transport layer (ETL) as the first electron transport layer, the second electron transport layer (ETL), the light emitting layer (EML), the hole transport layer (HTL), the hole injection layer (HIL), and the transparent anode that is formed of ITO or IZO are sequentially layered on the substrate.

Figure 2:
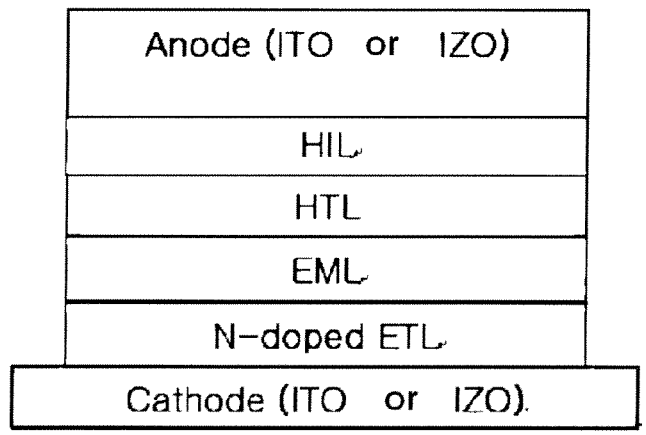

FIG. 2 is a view that illustrates an organic light emitting diode according to a second embodiment of the present invention.

As shown in FIG. 2, the organic light emitting diode having the inverted structure according to the second embodiment has a structure in which the transparent cathode that is formed of ITO or IZO, the n-doped electron transport layer (ETL), the light emitting layer (EML), the hole transport layer (HTL), the hole injection layer (HIL), and the transparent anode that is formed of ITO or IZO are sequentially layered on the substrate.

MODE FOR INVENTION

Hereinafter, the present invention will be described in more detail through Examples. However, the following Examples are set forth to illustrate but are not to be construed to limit the present invention.

Example 1

The transparent IZO cathode having the thickness of 1000 Å was formed by using the sputtering method on the substrate, and the n-type doped electron transport layer having the thickness of 50 Å was formed thereon by doping Ca on the electron transport material of the following Formula A in an amount of 10% as the first electron transport layer. Subsequently, the second electron transport layer having the thickness of 150 Å was formed on the first electron transport layer by using the electron transport material of the following Formula A.

In addition, the light emitting layer having the thickness of 300 Å was formed by depositing $Alq_3$ (aluminium tris(8-hydroxyquinoline)) of the following Formula under the vacuum, and the hole transport layer having the thickness of 400 Å was formed thereon by depositing NPB of the following Formula under the vacuum. Subsequently, the hole injection layer having the thickness of 500 Å was formed thereon by depositing the following HAT material under the vacuum. The IZO layer having the thickness of 1750 Å was formed thereon. In addition, the transparent IZO anode having the thickness of 1750 Å was formed on the hole injection layer.

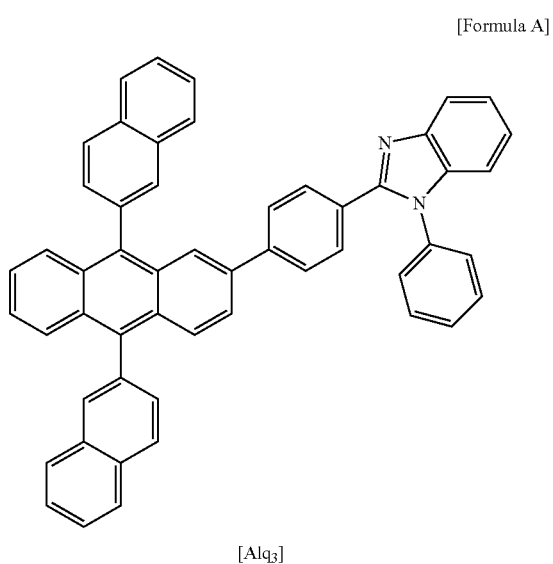

[Formula A]

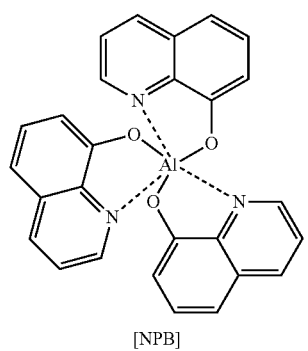

[$Alq_3$]

[NPB]

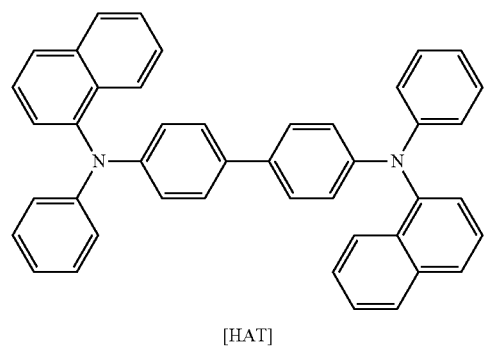

[HAT]

-continued

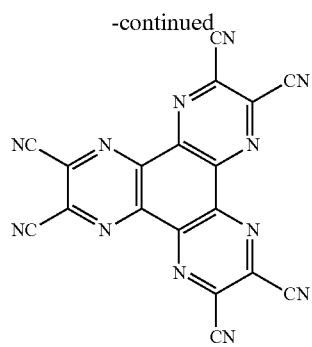

In the above process, the deposition speed of the organic material was maintained at 0.4 to 1.0 Å/sec, and the degree of vacuum in the deposition was maintained at $2 \times 10^{-7}$ to $2 \times 10^{-8}$ torr.

Figure 3:
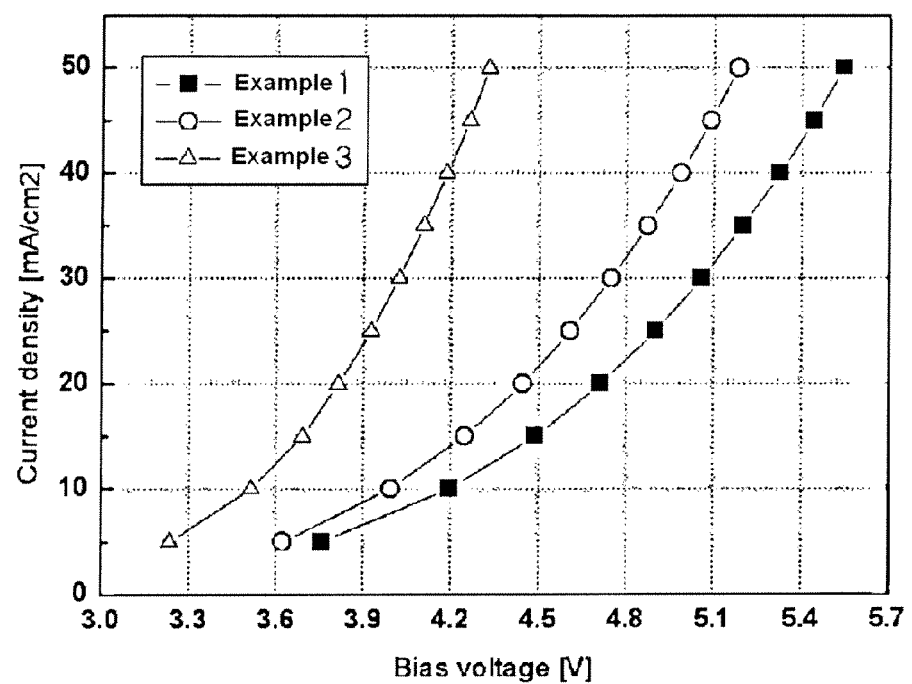
FIG. 3 illustrates a current density according to a DC bias voltage of organic light emitting diodes of Examples 1 to 3.
Figure 4:
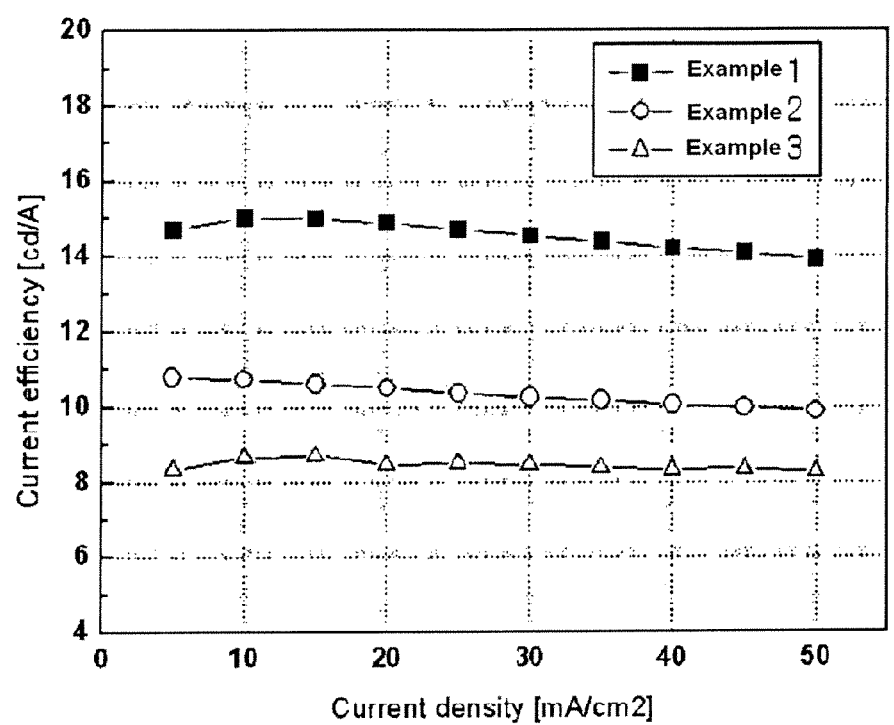
FIG. 4 illustrates current efficiency according to a current density of organic light emitting diodes of Examples 1 to 3.
Figure 5:
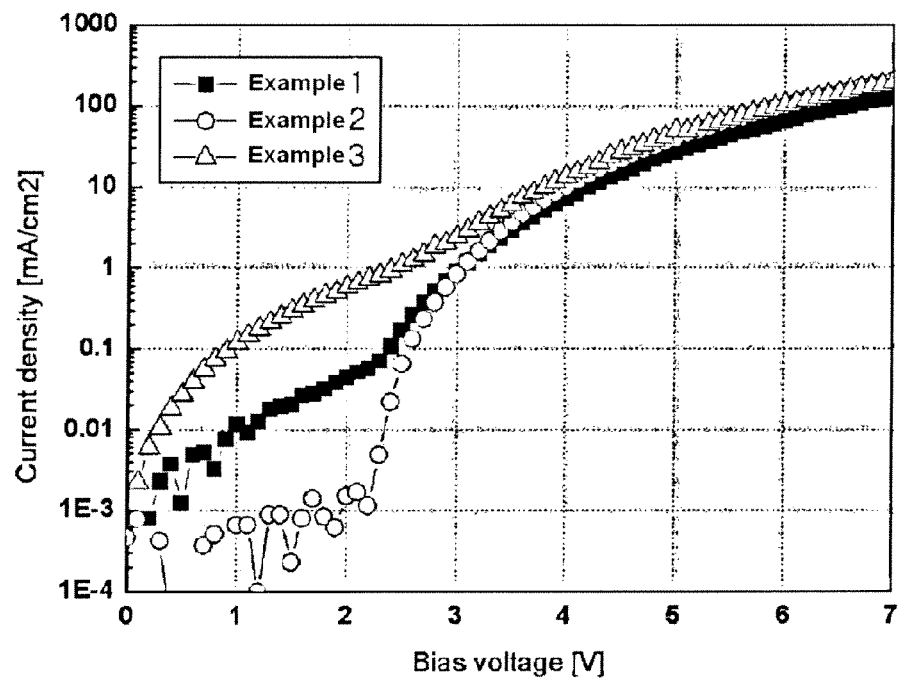
FIG. 5 illustrates a current density according to a bias voltage of organic light emitting diodes of Examples 1 to 3.

The voltage was sequentially applied to the organic light emitting diode that was manufactured in Example 1 at an interval of current density of 0.2 mA/cm$^2$, such that each voltage and brightness leakage current were measured, and the results are shown in FIGS. 3, 4 and 5. FIGS. 3, 4, and 5 are graphs that illustrate current-voltage properties and light emitting properties of the organic light emitting diode. In the graphs, when Ca was doped to the electron transport material in an amount of 10%, if the injection and movement of the electrons were not accomplished, normal rectifying current and light emitting properties are not shown or the high voltage and a reduction in light emission property are shown. However, in the organic light emitting diode that was manufactured in Example 1, as shown in FIGS. 3 and 4, the driving voltage was 3.7 V at the current density of 5 mA/cm$^2$ and the brightness was 14.7 cd/A, and the leakage current property shown in FIG. 5 was stable, such that the intrinsic diode properties of the organic light emitting diode were shown.

Example 2

The transparent IZO cathode having the thickness of 1000 Å was formed by using the sputtering method on the substrate, and the n-type doped electron transport layer having the thickness of 200 Å was formed thereon by doping Ca on the electron transport material of the following Formula A in an amount of 10% as the electron transport layer. In addition, the light emitting layer having the thickness of 300 Å was formed by depositing Alq$_3$ (aluminium tris(8-hydroxyquinoline)) of the Formula of Example 1 under the vacuum, and the hole transport layer having the thickness of 400 Å was formed the on by depositing NPB of the Formula under the vacuum. Subsequently, the hole injection layer having the thickness of 500 Å was formed thereon by depositing the HAT material of Example 1 under the vacuum. The IZO layer having the thickness of 1750 Å was formed thereon. In addition, the transparent IZO anode having the thickness of 1750 Å was formed on the hole injection layer.

In the above process, the deposition speed of the organic material was maintained at 0.4 to 1.0 Å/sec, and the degree of vacuum in the deposition was maintained at $2 \times 10^{-7}$ to $2 \times 10^{-8}$ torr.

The voltage was sequentially applied to the organic light emitting diode that was manufactured in Example 2 at an interval of current density of 0.2 mA/cm$^2$, such that each voltage and brightness leakage current were measured, and the results are shown in FIGS. 3, 4 and 5. FIGS. 3, 4, and 5 are graphs that illustrate current-voltage properties and light emitting properties of the organic light emitting diode. In the graphs, when Ca was doped to the electron transport material in an amount of 10%, if the injection and movement of the electrons were not accomplished, normal rectifying current and light emitting properties are not shown or the high voltage and a reduction in light emission property are shown. However, in the organic light emitting diode that was manufactured in Example 2, as shown in FIGS. 3 and 4, the driving voltage was 3.6 V at the current density of 5 mA/cm$^2$ and the brightness was 10.8 cd/A, and the leakage current property shown in FIG. 5 was stable, such that the intrinsic diode properties of the organic light emitting diode were shown.

Example 3

The transparent IZO cathode having the thickness of 1000 Å was formed by using the sputtering method on the substrate, and the n-type electron transport layer having the thickness of 200 Å was formed thereon by doping Mg on the electron transport material of the following Formula A in an amount of 10%. The residual steps were the same as those of Example 2.

The voltage was sequentially applied to the organic light emitting diode that was manufactured in Example 3 at an interval of current density of 0.2 mA/cm$^2$, such that each voltage and brightness leakage current were measured, and the results are shown in FIGS. 3, 4 and 5.

Comparative Example 1

The transparent IZO cathode having the thickness of 1000 Å was formed on the substrate by using the sputtering method, and the process was performed by using the same method as Example 2, except that the electron transport layer having the thickness of 200 Å was formed while Ca was not doped on the electron transport material of Formula A.

Figure 6:
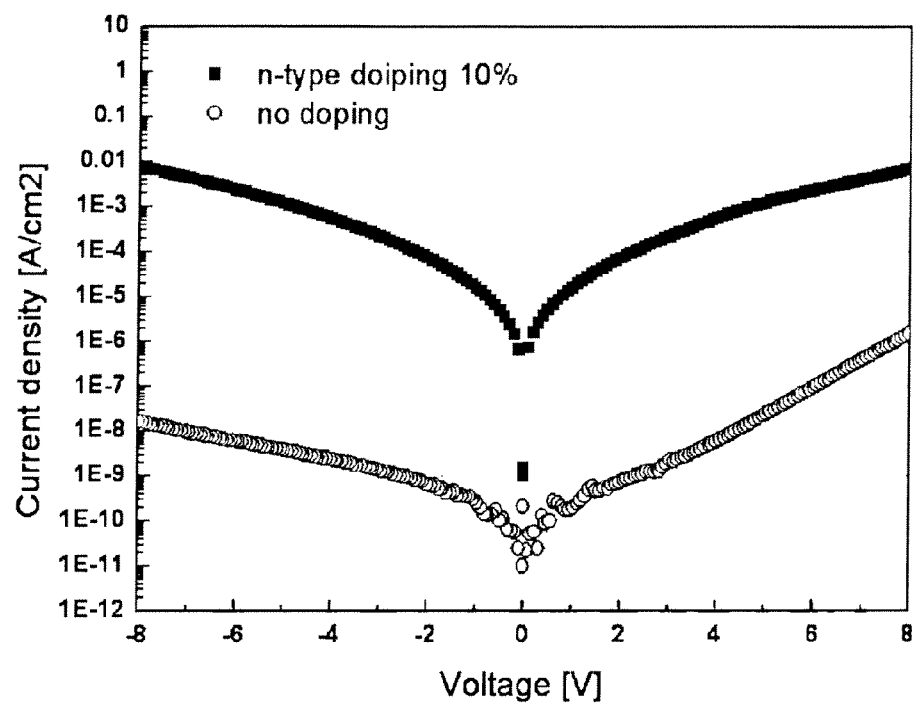
FIG. 6 illustrates a current density according to a bias voltage of each organic light emitting diode of Example 3 and Comparative Example 1.

As shown in FIG. 6, Example 3 showed the current density and light emitting properties according to the bias voltage. However, in the case of Comparative Example, the electron transport layer that was not n-doped did not show the light emitting property because the electron injection was almost impossible from the IZO that was the high work function. FIG. 6 is a current-voltage property according to the presence of the n-type doping of the electron transport material on the IZO electrode. As shown in FIG. 6, in the case of when the electron transport layer was not n-doped, the ability of injecting the electrons was largely deteriorated.

Comparative Example 2

The diode was manufactured by using the same method as Example 1, except that the organic light emitting diode had the positive structure. However, this diode was not operated by the sputtering damage when the upper electrode was formed.

The invention claimed is:
1. An inverted structure OLED (organic light emitting diode) comprising:
   a substrate;
   a transparent cathode that is disposed on the substrate;
   a transparent anode; and
   an organic material layer that is disposed between the transparent cathode and the transparent anode, wherein the organic material layer comprises an n-type doped first electron transport layer, a second electron transport layer adjacent thereto, a light emitting layer adjacent thereto, a hole transport layer adjacent thereto, and a hole injection layer adjacent thereto, that are disposed on the transparent cathode, wherein the n-type doped first electron transport layer comprises an electron transport material and an n-type dopant, wherein the n-type dopant comprises at least one that is selected from the group consisting of NaF, CsF, $MgF_2$, $CaF_2$, MgO, CaO, BaO, SrO, $Li_2O$, $Na_2O$, $K_2O$, $Cs_2O$, $Cs_2CO_3$, Mg, Ca, Na, K, Cs, LiF and KF, wherein the electron transport material comprises one or more compound that comprises at least one functional group selected from the group consisting of an imidazole group, an oxazole group, and a thiazol group, wherein the inverted structure OLED emits light through both the transparent cathode and the transparent anode, wherein the transparent cathode and the transparent anode are formed of at least one transparent metal oxide that is selected from ITO (Indium Tin Oxide), IZO (Indium Zinc Oxide), and ZnO (Zinc Oxide), wherein the n-type doped first electron transport layer is in direct contact with the transparent metal oxide of the transparent cathode, wherein the n-type dopant has a concentration gradient in a thickness direction of the n-type doped first electron transport layer, wherein the n-type dopant exists in a content of 1 to 50 wt % within 50% of a thickness of the n-type doped first electron transport layer at a transparent cathode side, and wherein the transparent anode is disposed adjacent to the hole injection layer which comprises the compound of the following Formula 23:

[Formula 23]

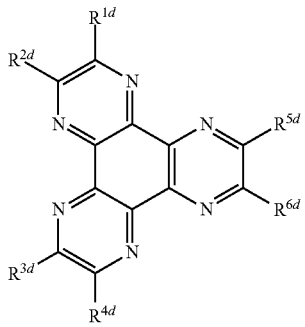

wherein $R^{1d}$ to $R^{6d}$ are each selected from the group consisting of hydrogen, halogen atom, nitrile(—CN), nitro(—$NO_2$), sulfonyl(—$SO_2R$), sulfoxide(—SOR), sulfonamide(—$SO_2NR$), sulfonate(—$SO_3R$), trifluoromethyl(—$CF_3$), ester(—COOR), amide(—CONHR or —CONRR'), substituted or unsubstituted straight-chained or branched-chained $C_1$-$C_{12}$ alkoxy, substituted or unsubstituted straight-chained or branched-chained $C_1$-$C_{12}$ alkyl, substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl and substituted or unsubstituted 5-7 hetero ring.

2. The inverted structure OLED (organic light emitting diodes) according to claim 1, wherein the transparent cathode or the transparent anode is formed of an electrode material that has a work function of 2.7 eV or more.

3. The inverted structure OLED (organic light emitting diode) according to claim 1, wherein the content of the n-type dopant is 0.5 to 50 wt % on the basis of the total weight of the material of the n-type doped first electron transport layer.

4. The inverted structure OLED (organic light emitting diode) according to claim 1, wherein the second electron transport layer is formed of the same material as the electron transport material of the n-type doped first electron transport layer.

5. A method for manufacturing an inverted structure OLED (organic light emitting diode), the method comprising the steps of:

forming a transparent cathode on a substrate;

forming an organic material layer on the transparent cathode; and forming a transparent anode on the organic material layer, wherein the forming of the organic material layer comprises forming sequentially an n-type doped first electron transport layer, a second electron transport layer, a light emitting layer, a hole transport layer and a hole injection layer that are disposed on the transparent cathode, and the n-type doped first electron transport layer comprises an electron transport material and an n-type dopant, wherein the n-type dopant comprises at least one that is selected from the group consisting of NaF, CsF, $MgF_2$, $CaF_2$, MgO, CaO, BaO, SrO, $Li_2O$, $Na_2O$, $K_2O$, $Cs_2O$, $Cs_2CO_3$, Mg, Ca, Na, K, Cs, LiF and KF, wherein the electron transport material comprises one or more compound that comprises at least one functional group selected from the group consisting of an imidazole group, an oxazole group, and a thiazol group, wherein the inverted structure OLED emits light through both the transparent cathode and the transparent anode, wherein the transparent cathode and the transparent anode are formed of at least one transparent metal oxide that is selected from ITO (Indium Tin Oxide), IZO (Indium Zinc Oxide), and ZnO (Zinc Oxide), wherein the n-type doped first electron transport layer is in direct contact with the transparent metal oxide of the transparent cathode, wherein the n-type dopant has a concentration gradient in a thickness direction of the n-type doped first electron transport layer, wherein the n-type dopant exists in a content of 1 to 50 wt % within 50% of a thickness of the n-type doped first electron transport layer at a transparent cathode side, and wherein the transparent anode is disposed adjacent to the hole injection layer which comprises the compound of the following Formula 23:

[Formula 23]

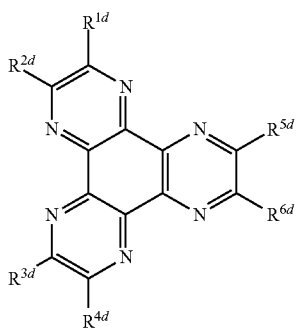

wherein $R^{1d}$ to $R^{6d}$ are each selected from the group consisting of hydrogen, halogen atom, nitrile(—CN), nitro(—NO$_2$), sulfonyl(—SO$_2$R), sulfoxide(—SOR), sulfonamide(—SO$_2$NR), sulfonate(—SO$_3$R), trifluoromethyl(—CF$_3$), ester(—COOR), amide(—CONHR or —CONRR'), substituted or unsubstituted straight-chained or branched-chained C$_1$-C$_{12}$ alkoxy, substituted or unsubstituted straight-chained or branched-chained C$_1$-C$_{12}$ alkyl, substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted C$_1$-C$_{60}$ alkyl, substituted or unsubstituted aryl and substituted or unsubstituted 5-7 hetero ring.

6. A lighting apparatus comprising the inverted structure OLED (organic light emitting diode) according to claim 1.

7. The inverted structure OLED (organic light emitting diode) according to claim 1, wherein a transmissivity of light of the transparent cathode and the transparent anode is 80% or more.

8. The method for manufacturing an inverted structure OLED (organic light emitting diode) according to claim 5, wherein a transmissivity of light of the transparent cathode and the transparent anode is 80% or more.

9. The inverted structure OLED (organic light emitting diode) according to claim 1, wherein the transparent cathode or the transparent anode is an electrode material that has a work function of 4.5 eV or more.

\* \* \* \* \*